United States Patent [19]
Baker

[11] Patent Number: 5,197,089
[45] Date of Patent: Mar. 23, 1993

[54] PIN CHUCK FOR LITHOGRAPHY SYSTEM
[75] Inventor: David G. Baker, Shrewsbury, Mass.
[73] Assignee: Hampshire Instruments, Inc., Rochester, N.Y.
[21] Appl. No.: 526,565
[22] Filed: May 21, 1990
[51] Int. Cl.5 .............................................. G21K 5/00
[52] U.S. Cl. ...................................... 378/34; 378/208; 250/491.1; 250/492.2; 414/222; 414/225; 414/226
[58] Field of Search ............... 378/34, 35, 208; 414/217, 225, 416, 417, 222, 226, 404, 331; 250/492.2, 491.1

[56] References Cited
U.S. PATENT DOCUMENTS

| 4,335,313 | 6/1982 | Kreuzer et al. | 378/34 |
|---|---|---|---|
| 4,475,223 | 10/1984 | Taniguchi et al. | 378/34 |
| 4,516,253 | 5/1985 | Novak | 378/34 |
| 4,584,045 | 4/1986 | Richards | 414/222 |
| 4,735,540 | 4/1988 | Allen et al. | 414/222 |
| 4,776,744 | 10/1988 | Stonestreet et al. | 414/217 |
| 4,776,745 | 10/1988 | Foley | 414/217 |
| 4,789,294 | 12/1988 | Sato et al. | 414/222 |
| 4,806,057 | 2/1989 | Cay et al. | 414/225 |
| 4,820,930 | 4/1989 | Tsutsui et al. | 414/416 |
| 4,870,668 | 9/1989 | Frankel et al. | 378/34 |
| 4,886,412 | 12/1989 | Wooding et al. | 414/416 |
| 4,907,931 | 3/1990 | Mallory et al. | 414/225 |
| 4,917,556 | 4/1990 | Stark et al. | 414/217 |
| 4,936,329 | 6/1990 | Michael et al. | 414/416 |
| 4,969,790 | 11/1990 | Petz et al. | 414/222 |
| 4,985,722 | 1/1991 | Ushijima et al. | 414/416 |

Primary Examiner—Edward P. Westin
Assistant Examiner—Kim Kwok Chu
Attorney, Agent, or Firm—Harry W. Barron

[57] ABSTRACT

A pin chuck holds a wafer during translation by an X-ray lithography machine. The chuck is designed to be the same size as the wafer and includes a plurality of extensions having tops along a common plane. The space between the extensions is evacuated to hold and level the wafer. In order to load or remove a wafer from the pin chuck, three extendable posts are provided which can be extended to permit a robot arm to position a wafer thereon for lowering to the pin chuck or remove a wafer therefrom lifted from the pin chuck. The three posts are triangularly positioned within a space sufficient to hold the wafer which at the same time close enough together to permit the fingers of the robot arm to fit therearound.

15 Claims, 3 Drawing Sheets

5,197,089

PIN CHUCK FOR LITHOGRAPHY SYSTEM

BACKGROUND OF THE INVENTION

1. Field of the Invention

This invention relates to a chuck for holding a semiconductor wafer shaped device during operation of a lithography machine, and more particularly, to such a chuck having a size as large as the wafer shaped device and further having a mechanism to permit the wafer devices to be placed on such chuck by only contacting the bottom of the wafer shaped device.

2. Description of the Prior Art

Semiconductor devices have for many years been fabricated in part by using a lithography machine for creating certain patterns on a photoresist covered semiconductor wafer. Until recently, visible or ultraviolet light has been used as the energy source to expose the resist covered wafer. However, recent advances in semiconductor processing techniques have required features smaller than can be easily patterned by conventional lithography machines. In order to pattern smaller features on a semiconductor wafer, new, shorter wavelength, energy sources are required. The next logical energy source is the X ray.

One example of X-ray lithography machines is shown in U.S. Pat. No. 4,870,668 in the name of Frankel et al and entitled "Gap Sensing/Adjustment Apparatus And Method For A Lithography Machine". In the type of machine shown in the Frankel et al patent, a source of X-rays is emitted from a plasma created by focusing a laser beam on a metal target. The X-rays travel through an exposure column towards a mask mounted at the end thereof. The resist covered wafer is moved in discrete steps across the mask, with a very small gap existing between the mask and the wafer surface being exposed. In order to take advantage of the small features which can be patterned using the X-ray lithography machine of the Frankel et al patent, a very precise and repeatable translation device, or stepper mechanism, is required and is described therein. Such a device includes a wafer chuck for holding the wafer being exposed as well as various translating means for moving the chuck in extremely accurate and minute steps.

In order to accurately and precisely use the X-ray lithography machine of the Frankel et al patent, it is necessary to precisely align each section of the wafer being exposed relative to the mask. This, in turn, requires that the mask be properly attached to the exposure column and the wafer be placed on the stepper mechanism. In using the stepper mechanism, care must be taken to avoid damaging the wafers and mask, particularly when placing these items on and off the wafer chuck portion of the stepper mechanism. This is particularly true with respect to the mask, which is an extremely delicate item.

Because of the precision required in an X-ray lithography mechanism of the type described by the Frankel et al U.S. Pat. No. 4,870,668, it is necessary to individually level each section of the wafer relative to the mask because of imperfections found on the flatness of the wafers. In view of such precision requirements, it is necessary to hold the wafers very carefully, preferably in a vacuum chuck having an evacuated holding area the same size and shape as the wafer itself. Such a chuck is shown in U.S. Pat. No. 4,213,698 in the name of Firtion et al entitled, "Apparatus and Method For Holding And Planarizing Thin Workpieces".

In the past, wafers have generally been placed on wafer chucks by robots. However, automatic or robotic operation required a relatively small chuck plate upon which the wafer rested in order to allow the robot arm to grasp the wafer from beneath. Alternatively, wafers have been held from the sides or top, which is undesirable because of the damage to the partially processed wafer, or wasteful of wafer area if special gripping areas are provided to hold the wafer. In some instances, the wafer itself is slid onto the wafer chuck plate which makes alignment very difficult. In the above noted Firtion et al U.S. Pat. No. 4,213,698, a pair of tweezers was used to place the wafer on the chuck plate. What is needed is a more accurate and less damaging technique and apparatus to load and unload the wafers from the wafer chuck.

In the past, masks have been installed in the lithography machine individually by hand, or by special mask handling apparatus. Because of the critical relationship between an X-ray mask and the wafer being exposed, as well as the delicate nature of X-ray mask, extreme care must me taken to properly position and affix the X-ray mask. Mask replacements or changes invariably result in significant delays in the processing of wafers, particularly where masks must be changed often. Mask changing also results in additional apparatus having to be provided if the mask installation is to be mechanized. What is needed is a simple means, utilizing the existing wafer handling apparatus used for positioning the wafer during the exposure processing, which can additionally be used to install the masks.

An example of wafer handling and mask handling apparatus is shown in U.S. Pat. No. 4,516,253 to W. Thomas Novak, entitled "Lithography System". An example of a mask tray used in loading a mask onto an X-ray lithography machine is shown in U.S. Pat. No. 4,549,843 to Peter R, Jagusch et al entitled "Mask Loading Apparatus, Method and Cassette".

SUMMARY OF THE INVENTION

In accordance with one aspect of this invention, there is provided in a lithography system, apparatus for holding and transporting a wafer shaped device comprising a platform, sized and shaped to receive and hold the wafer shaped device, and at least three posts. The ends of the posts are selectively movable between a home position within the platform and an extended position above the platform. In addition, the apparatus includes a radially, rotationally and vertically movable arm having a pair of spaced apart fingers at an end thereof, the fingers being spaced by a sufficient amount to fit around the posts when the post is in the extended position. The arm is operated to support a wafer shaped device being transported from beneath, to place the wafer shaped device on the extended posts, and to remove the wafer shaped device from the extended posts. The posts are movable to lower a wafer shaped device placed thereon to a position to be held by the platform and to raise such wafer shaped device to permit its removal by the arm.

BRIEF DESCRIPTION OF THE DRAWINGS

One preferred embodiment of the subject invention is hereafter described with specific reference being made to the following FIGs., in which.

DETAILED DESCRIPTION

Figure 1:
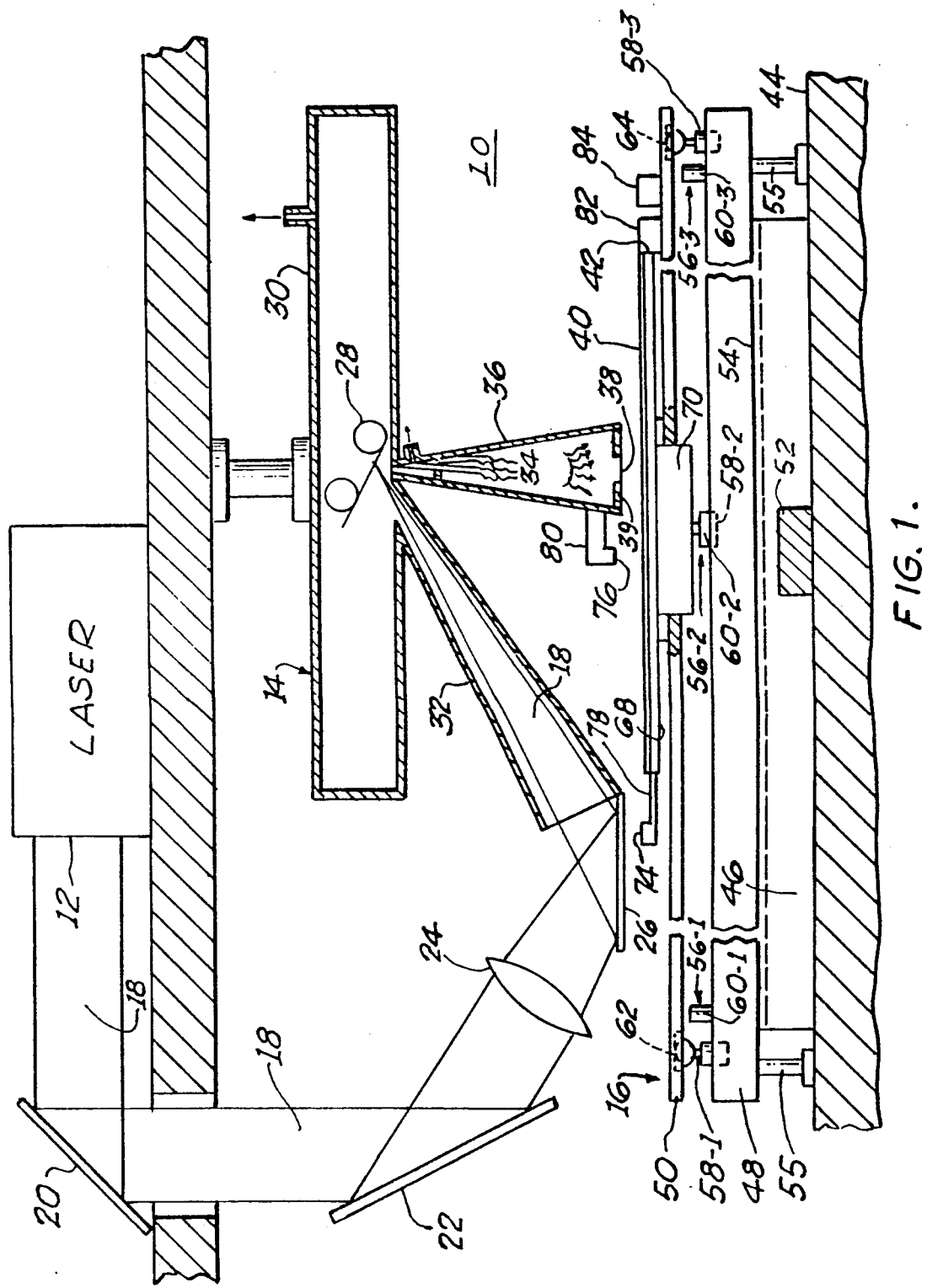
FIG. 1 shows a side elevation view, partially in cross section, of the translation mechanism and exposure system used in the X-ray lithography system of the subject invention.

Referring now to FIG. 1, an X-ray lithography machine 10 is generally shown and includes a high peak power and repetition rate pulsed laser 12, an X-ray source 14, and a wafer handling mechanism 16 as the principal components of machine 10. Laser 12 provides a laser beam 18 which is directed by mirrors 20 and 22 and focused by lens 24 and finally directed by mirror 26 towards X-ray source 14. Laser beam 18 provided by laser 12 should be powerful enough to cause an X-ray emitting plasma to be formed when beam 18 is focused on a metal target.

X-ray source 14 includes a cassette target 28 contained within an evacuated chamber 30. Laser beam 18 is provided through laser beam port 32, which is a part of evacuated chamber 30, and focused by lens 24 to a focal point on target 28. The intensity of laser beam 18 is sufficient to create an X-ray emitting plasma at the focal point on target 28 and the plasma, in turn, emits X-rays 34 into an exposure column 36. The broad concept of exposure column 36 is shown and described in U.S. Pat. No. 4,484,339 in the name of Phillip J. Mallozzi et al.

X-ray mask 38, which is positioned at the bottom of exposure column 36, is of a type which blocks certain X-rays 34 and permits the remaining X-rays 34 to pass therethrough, thereby providing a defined pattern of X-rays from the exposure column 36. Mask 38 may be of a type described in Published European Patent Application No. 244,246, entitled "X-Ray Mask and Structure" in the name of Irving Plotnik, which application is owned by the assignee hereof.

Wafer handling mechanism 16 is of the type in which a semiconductor wafer 40 is held in a chuck 42 and moved in steps so that one exposure section at a time of wafer 40 is positioned beneath exposure column 36 to be exposed by the pattern of X-rays 34. In fabricating a semiconductor chip, many various series of operations on each exposure section of wafer 40 are performed. Many of these operations include exposing a pattern on each exposure section followed by further processing that exposed pattern in a predetermined fashion. Except for the first layer, each pattern is exposed on top of a previously exposed and processed layer of wafer 40. It is extremely important that each new exposure section be properly aligned with respect to the position of proceeding exposure section 86 in order that the fabricated chip operates properly.

In order to preform proper movement and alignment of each section of wafer 40, wafer handling mechanism 16 must be capable of moving wafer 40 with six degrees of freedom. These six degrees of freedom include three linear directions, that is, the X direction, the Y direction, and the Z direction, and three angular directions. In FIG. 1, the X direction may be right to left, the Y direction may be in and out of the paper and the Z direction may be up and down. Mechanism 16 rides on a flat granite base 44 and includes a Y stage 46 and an X stage 48. Affixed above and to X stage 48 is a substage 50 upon which the control mechanisms for Z movement, and the rotational movements are mounted. Substage 50 is affixed to X stage 48 and moves therewith in the X and Y directions.

Y stage 46 moves over granite base 44 in a direction determined by a guide 52 affixed to granite base 44. Guide 52 determines the Y direction and Y stage 46 moves back and forth along guide 52 in that determined direction. Y stage 46 has a guide 54 affixed thereto defining the X direction and X stage 48 moves along guide 54. Substage 50 is positioned above X stage 48 by three legs 56-1, 56-2 and 56-3, each of which includes a stepper motor assembly 58-1 through 58-3 and a sensor 60-1 through 60-3. The three motor assemblies 58-1 through 58-3 are independently controllable to raise or lower one triangular corner of substage 50 in the Z direction. Each assembly 58-1 through 58-3 shaft is precisely guided by means of flexure pivots (not shown). By moving each of the three motor assemblies 58-1 through 58-3 together, small incremental movements in the Z direction can be obtained. By moving one or two of the motor assemblies 58-1 through 58-3 individually, the tip and tilt degrees of freedom referred to earlier can be obtained.

Motor assemblies 58-1 through 58-3 are rigidly affixed in a vertical direction from the X stage 48. This causes a slight lateral movement of substage 50, relative to the fixed drive shafts of the motor assemblies 58-1 through 58-3, to occur during the tipping or tilting of substate 50. To permit this lateral movement, the shaft connecting motor assembly 58-1 to substage 50 includes a ball and socket coupling 62 designed to prevent any lateral movement. However, the coupling of the shaft from motor assembly 58-2 to substage 50 is a ball and vee grove coupling 64, designed to permit lateral movement in either the x- or y-direction only, and the coupling of the shaft from motor assembly 58-3 to substage 50 is a ball and flat coupling 66 (seen in FIG. 3), designed to allow lateral movement in either of the X or Y directions.

Y stage 46 moves along Y guide 52 by conventional driver means (not shown) in discrete steps and X stage 48 moves along guide 54 by similar conventional drive means (not shown). X stage 48 is held above Y stage 46 by four air bearings 55 extending down from the corners thereof. Air bearings 55 glide along granite base 44 in the direction defined by guide 54. By spacing the four air bearings 55 as far apart as possible, the slight variations in the plane of granite base 44 cause relatively small and repeatable tip and tilt changes in the wafer 40 held by chuck 42. Adjustments to the tip and tilt position of wafer 40 can then be made by the apparatus and techniques hereafter described.

Figure 3:
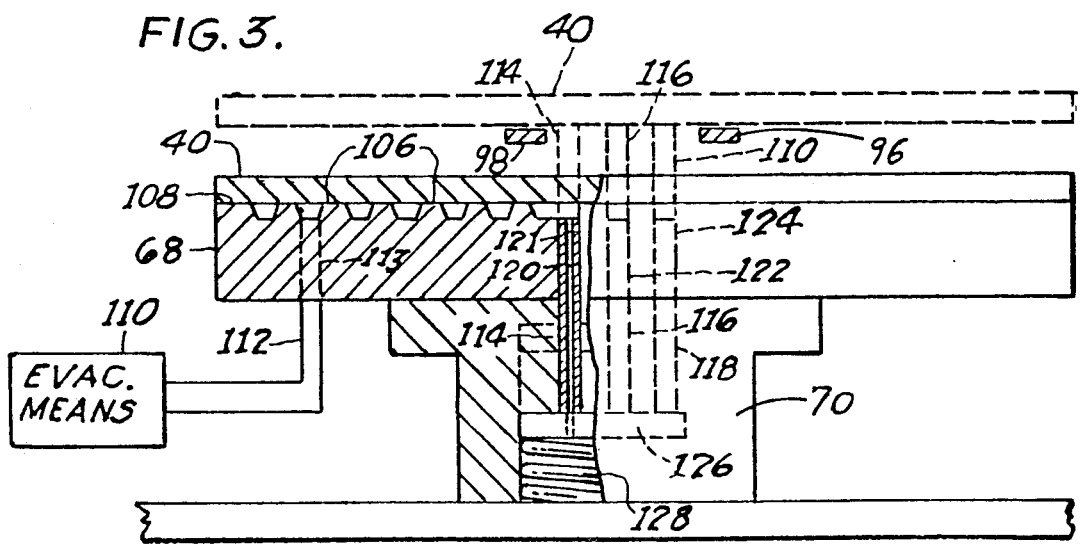
FIG. 3 shows a more detailed view of the pin chuck portion of the translation mechanism, as shown in FIG. 2, when loading or unloading a wafer.

Chuck 42 includes a chuck plate 68 for holding wafer 40 and beneath chuck plate 68 is wafer lifting mechanism 70, both of which are shown in more detail in FIG. 3. The Z movement is controlled by motor assemblies 58-1 through 58-3, which have incremental steps of 0.08 microns and a maximum range of 400 microns.

In order to properly position wafer 40 with respect to mask 38, a chuck sensor 74 and X-ray chamber sensor 76 are provided, each of which is coupled to the respective chuck 42 and exposure column 36 by respective brackets 78 and 80. The detailed construction and operation of sensor 74 and 76 are described in the aforementioned U.S. Pat. No. 4,870,668 to Frankel.

The precise X and Y positions of wafer handling mechanism 16 can be determined by a interferometer device. Such a device is well known in the art and includes a light transmitting device (not shown), one of the Y mirror 82 or the X mirror 84, and a light receiving device (not shown). The interferometer device measures the accumulated Doppler shift between transmitted and received light beam and thereby determines very precise displacements. For example, the interferometer devices may measure relative X and Y distances in lithography system 10 in the order of 0.02 micron. The Y mirror 82 and X mirror 84 associated with the two interferometer devices are mounted on substage plate 50 very close to the same height as wafer 40. By mounting mirrors 82 and 84 in this position, any corresponding X and Y lateral movement at the wafer 40 exposure plane due to the tip and tilt adjustment by fine Z motor assemblies 58-1 through 58-3 is monitored by the interferometer.

In addition, there is associated with chuck plate 68 means (not shown) for rotating the plate 68 to provide a rotational degree of freedom movement. Such means are well known in the art and are described in U.S. Pat. No. 4,444,492 in the name of Martin E. Lee.

Figure 2:
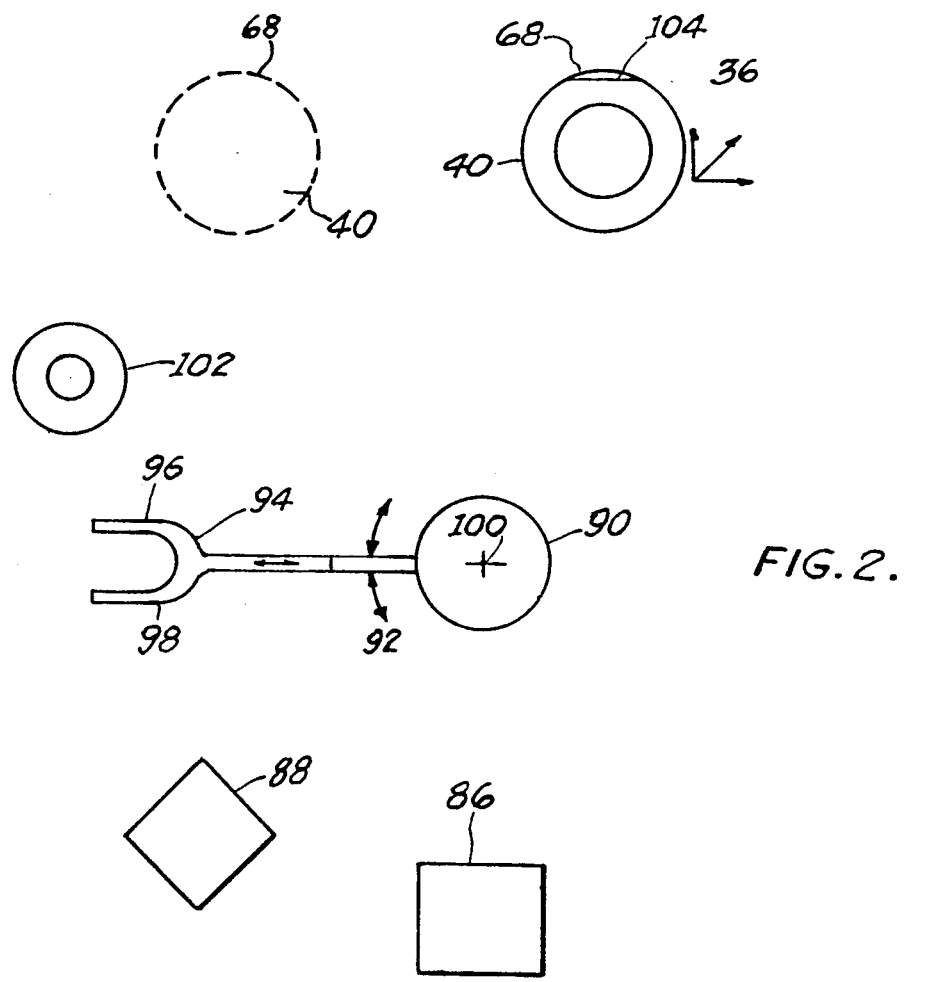
FIG. 2 shows, in schematic, a top view of the relative position of the various components of an X-ray lithography machine of the type contemplated by the subject invention.

Referring now to FIG. 2, a schematic diagram illustrates the relative positioning of the various components of lithography system 10 used in the transporting of wafers 40 to be exposed from the external carriers 86 and 88 to the chuck plate 68. Wafers are initially held in one of two wafer carriers 86 and 88, which are loaded into the lithography machine 10 in a known manner, such as shown in the aforementioned U.S. Pat. No. 4,549,843. Carriers 86 and 88 may include elevator mechanisms to permit the wafers 40 to be inserted into the lithography machine 10 environment without permitting external contamination, such as air, to enter the machine 10 environment.

In addition, a robot mechanism 90 is provided and includes a robot arm 92. Arm 92 has a U shaped hand 94 having a pair of spaced apart fingers 96 and 98 extending therefrom. Robot arm 92 is movable in the lateral direction inward and outward and in the rotational direction around the center 100 of robot 90. Carriers 86 and 88 are positioned radially from center 100 so as to permit wafers 40 to be inserted or removed therefrom by rotating and laterally moving arm 92.

A pre-aligner 102 may be included for prealigning the wafer 40 by detecting the flat side 104 thereof and positioning it in the proper rotational direction. An example of pre-aligner 102 is shown in U.S. Pat. No. 4,457,664 in the name of Neil H, Judell et al, entitled "Wafer Alignment Station". In addition, pre-aligner 102 is used to assure the rotational center of the wafer 40 is properly positioned to permit wafer 40 to be transported to chuck plate 68. Again pre-aligner 102 is positioned radially to center 100 of robot 90 so as to permit the wafers 40 to be placed thereon and removed therefrom by moving arm 92 laterally and rotationally.

Chuck plate 68 is movable in the X and Y directions from the dashed line position to the solid line position, as seen in FIG. 2. In the solid line position, chuck plate 68 is positioned beneath exposure column 36 so that the wafer 40 can be properly exposed. When in the solid line position, wafer 40 undergoes alignment relative to mask 38, in order that it can be properly exposed. Such alignment may be performed with the apparatus described in copending patent application Ser. No. 07/526,563, filed even date herewith, in the name of Robert Boni and Robert D. Frankel and entitled, "X-Ray Lithography Alignment System". Chuck plate 68, when in the dashed line position, is positioned radially with center 100 of robot 90 and within the lateral movement distance of arm 92 so that wafer 40 may be placed thereon or removed therefrom.

In moving wafer 40 from one component to another component in FIG. 2, robot arm 92 is extended to a position such that hand 94 is beneath the center of wafer 40. Then, robot 90 raises arm 92 to lift wafer 40 from its position and arm 92 is retracted, where necessary for clearance. Thereafter, arm 92 is rotated by robot 90 to the next radial positioned component and arm 92 is extended and lowered to place wafer 40 on the next component. Generally, there is no interference from the carriers 86 and 88 or prealigner 102 to prevent the hand 94 of robot 90 from placing wafer 40 thereon or removing wafer 40 therefrom. Specifically, only the edges of wafer 40 are in carriers 86 and 88 and the holding chuck of pre-aligner 102 is smaller than the spacing between fingers 96 and 98 of hand 94. However, it is desirable to fabricate chuck plate at least the same size as wafer 40 in order to properly hold wafer 40. For example, such a wafer chuck is shown in the aforementioned U.S. Pat. No. 4,213,698 in the name of Firtion et al.

Figure 4:
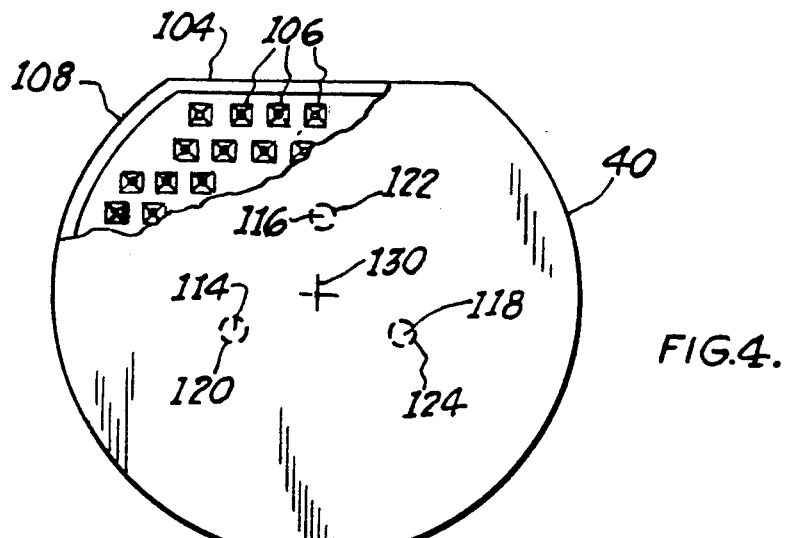
FIG. 4 shows a top view, partially in cut-away, of the pin chuck and wafer, shown in FIG. 3.

Referring now to FIGS. 3 and 4, a more detailed diagram of chuck plate 68 and wafer lifting mechanism 70 is shown. Wafer lifting mechanism 70 is attached to substage 50 and wafer chuck plate 68 is attached to the top of wafer lifting mechanism 70. Wafer chuck 68 has a plurality of closely spaced extensions 106, each having a top which is on the same plane as the top of the other extensions 106. In addition, a ring 108 extends around the group of extensions 106 and has a top surface on the same plane as the top surfaces of the extensions 106. Vacuum orifices or electrical contacts may be placed on ring 108 for connection to apparatus to be held on chuck plate 68, as will be explained hereafter with respect to FIGS. 5 and 6. Evacuation means 110 is attached to port 112 of chuck plate 68, which extends over internal path 113 into the space between extensions 106. In practice, there will be a plurality, such as four, of such internal paths 113 extending from port 112 to equally spaced different positions on the surface of chuck 68 between extensions 106. Evacuation means 110 operates to evacuate the space between each of the extensions 106 within the confines of ring 108. Thus, when a wafer 40 is placed on wafer chuck 68 and aligned over ring 108, thereby covering extensions 106 and ring 108, it is held in place by the pressure difference due to the evacuated space therebeneath. In addition, the evacuated space around extensions 106 and within ring 108 tends to straighten wafer 40 to a certain extent.

Mechanism 70 includes three posts 114, 116 and 118 extending therefrom into corresponding openings 120, 122 and 124 of wafer chuck 68. Each of the posts 114, 116 and 118 is affixed to a piston plate 126, which in turn forms the upper part of a bellows device 128. Pressure means (not shown) is connected to bellows 128 to cause it to selectively expand in a vertical direction when pressure is applied and to contract in a vertical direction when the pressure is removed. When bellows 128 expands, plate 126 is forced upward, thereby raising posts 114, 116 and 118. The length of posts 114, 116 and 118 is selected to be such that when bellows 128 is contracted, as shown in the solid lines in the cross-sectional portion of FIG. 3, posts 114, 116 and 118 are below the upper surface of chuck plate, formed by the machined upper surfaces of extensions 106 and ring 108. However, when bellows 128 is expanded, posts 114, 116 and 118 are raise well above the upper surface of chuck plate 68, as seen by the dashed lines in FIG. 3.

In addition, the spacing between posts 114, 116 and 118 is selected so that the fingers 96 and 98 of robot arm 92 fit entirely around them when extended. Further, posts 114, 116 and 118 are positioned at the apex of a triangle, preferably an equilateral triangle, around the center of gravity 130 of wafer 40 when positioned on chuck plate 68. Thus, when bellows 128 is expanded, posts 114, 116 and 118 become extended. If a wafer 40 is on wafer chuck 68 when posts 114, 116 and 118 are to be raised, the vacuum between the bottom of wafer 40 and the space around extensions 106 is released, and wafer 40 is raised. An open center 121 may be provided in each of posts 114, 116 and 118 and evacuated by evacuation means (not shown) to better hold wafer 40 on posts 114, 116, and 118 when they are raised. At this time, the fingers 96 and 98 of wafer arm 92 can be placed around posts 114, 116 and 118 just beneath the bottom of wafer 40. Thereafter, the vacuum in openings 121 is released and robot arm 92, including fingers 96 and 98, is raised, carrying wafer 40 away from chuck plate 68 and posts 114, 116 and 118. If it is desired to load a wafer 40 onto chuck plate 68, the wafer 40 is carried by fingers 96 and 98 of robot arm 92 to the position shown by the dashed lines in FIG. 3, and lowered to permit wafer 40 to rest on posts 114, 116 and 118. Then, the open center 121 of posts 114, 116 and 118 is evacuated and posts 114, 116 and 118 are then lowered by contracting bellows 128 and wafer 40 rests on ring 108 and extensions 106 of wafer chuck 68 and can thereafter be held by operating evacuating means 110.

Figure 5:
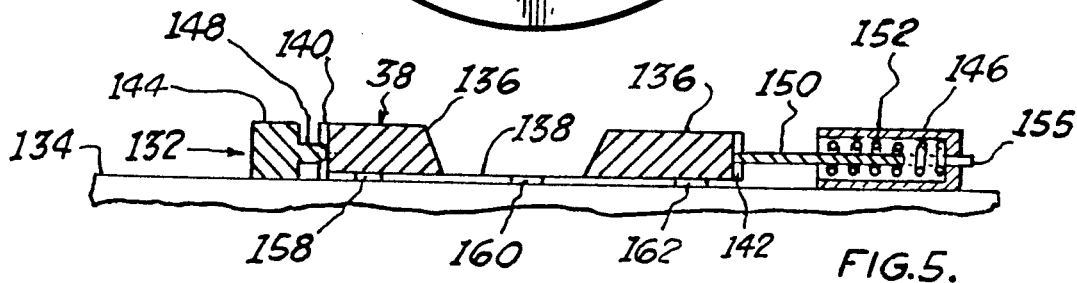
FIG. 5 shows a side view of a mask tray which can be positioned on the pin chuck shown in FIG. 3.
Figure 6:
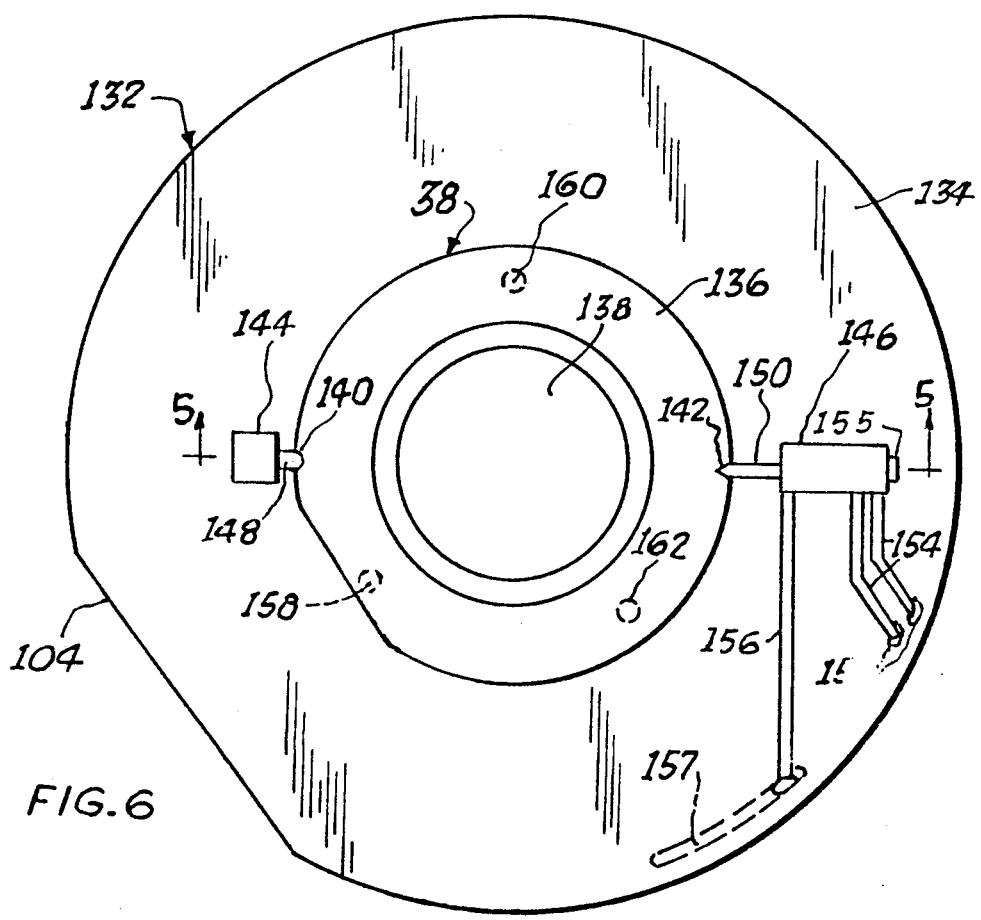
FIG. 6 shows a top view of the mask tray shown in FIG. 5.

Referring now to FIGS. 5 and 6, a mask tray 132 is shown, which is used to hold X-ray mask 38 while it is being affixed to the bottom of exposure column 36. Mask tray 132 is sized to be the same as a wafer 40 normally held by chuck plate 68 of wafer handling mechanism 16. For example, the base 134 of mask tray 132 may be a six inch circle with a flat 104 cut thereon, so that it is sized to fit on chuck plate 68 seen in FIGS. 3 and 4. The X-ray mask 38 includes a support ring 136 having a thin patterned membrane 138 across the ring 136 opening. Generally, support ring 136 may have an outer diameter of approximately three inches and membrane 138 may have a diameter of approximately one inch. Fabrication of mask 38 is described in detain in the aforementioned European published Patent Application No. 244,246.

Support ring 136 has two diametrically opposite lateral channels 140 and 142 fabricated on the outside surface thereof. Mask tray base 134 has placed thereon a pair of mask holding mechanisms 144 and 146 which include respective extensions pins 148 and 150 adapted to cooperate and fit against channels 140 and 142 when mask 38 is placed on mask tray 132. The extension pin 148 from holding mechanism 144 is generally stationary. The extension pin 150 from mechanism 146 is laterally movable by pneumatic or electrical solenoid means 152 and may assume one of two different positions.

The first position of extension pin 150 is secured against channel 142 so as to hold mask 38 firmly on mask plate 132 and this is the home position. The second position of extension pin 150 is completely remote from channel 142. Holding mechanism 146 may be coupled through flowpath 156 to a vacuum orifice 157 connected to a corresponding orifice on ring 108 of on the chuck plate 68. Normally, springs within mechanism 146 maintain pin 148 forward. When a vacuum is applied through flow path 156, pin 148 is moved from the forward first to the remote second position. At this point pin 152 contacts conductive end cap 155 and current may flow through leads 154 and contacts 156 to monitoring means (not shown) external to base 134. The monitoring means can sense whether pin 150 is fully retracted, and thus whether the mask 38 is ready to be loaded. The monitoring means is be coupled to leads 154 through contacts 156 from corresponding contacts (not shown) on ring 108 of chuck plate 68.

The support ring 136 of mask 38 is placed on mask tray 132 so as to rest on three legs 158, 160 and 162 extending upward from base 134. Legs 158, 160 and 162 are designed to be of a sufficient length to prevent any patterning on membrane 138 from touching base 134 and are positioned so as to contact the support ring 136 and not the patterned membrane 138.

Mask tray 132 may be used in either affixing a mask 38 to exposure column 36 or in removing a mask 38 from exposure column 38. By providing mask tray 132, the existing wafer handling mechanism 16, described above, may be utilized to transport the mask. This eliminates the special mask handling apparatus typical with prior art systems. To affix a mask 38 to exposure column 36, one starts by selecting the proper mask and attaching it to mask tray 132, so as to be held by extensions 148 and 150 positioned firmly against channels 140 and 142. In practice, each of the many masks similar to mask 38 will be stored on their own mask tray 132. Thus, each different mask 38 is only manually affixed once its mask tray 132. Further, the various masks similar to mask 38 will be stored in carriers, such as carriers 86 or 88, and when a particular mask is desired to be installed on exposure column 36, the carrier 86 or 88 will be taken and positioned on machine 10, as seen in FIG. 2. By knowing in which slot of carrier 86 or 88 the particular mask 38 is stored, commands can be given to machine 10 to cause robot arm 92 to retrieve the desired mask 38 and transport it to prealigner 102.

After the base 134 of mask tray 132 is properly prealigned, it is transported to chuck plate 68 in the manner previously described for transporting wafer 40. The Z motors assemblies 58-1 through 58-3 are lowered and chuck plate 68 is translated in the X and Y direction until mask 38 is properly aligned for insertion against the bottom of exposure column 36. At that time, Z motor assemblies 58-1 through 58-3 are operated to raise substage 50, and thereby cause mask 38 to move toward exposure column 36. After a vacuum is applied over flowpath 156, extension pin 50 is moved back to the second position, freeing mask 38 to move in the vertical direction. At this time, the vacuum means holding mask 38 in place on exposure column 36 is activated and as the Z motor assemblies 58-1 through 58-3 continue to raise substage 50, mask 38 is pulled into place against exposure column 36. In fact, mask 38 may actually jump the final several microns from base 134 to exposure column 36.

At this point mask 38 is loaded on exposure column. Now it is necessary to remove mask plate 132 and place it back into a carrier 86 or 88. To reposition wafer handling mechanism 16, the reverse of the mask loading procedure cannot be followed, because mechanisms 144 and 146 would contact the downward extending mask 38. To avoid such contact, repositioning of wafer handling mechanism 16 occurs by completely retracting extension 150 and moving wafer handling mechanism 16 slightly in the X direction to free both extensions 14B and 150 from channels 140 and 142. Then wafer handling mechanism 16 is moved in the Y direction so that mechanisms 144 and 146 are completely clear of mask 38. Finally, wafer handling mechanism 16 can be moved in the X direction to the dashed line position as seen in FIG. 2, so that mask tray 132 can be returned to a carrier 86 or 88.

When it is desired to remove mask 38 from exposure column 36, the procedure just described is done in reverse order.

What is claimed is:

1. In a lithography system, an apparatus for holding and transporting a wafer shaped device comprising:
   a platform sized and shaped to receive and hold said wafer shaped device;
   at least three posts, the ends of which are selectively movable between a home position within said platform and an extended position above said platform; and
   a radially, rotationally and vertically movable arm having a pair of spaced apart fingers at an end thereof, said fingers being spaced by a sufficient amount to fit around said posts when said posts are in said extended position, said arm being operated to support a wafer shaped device being transported from beneath, to place said wafer shaped device on said extended posts, and to remove said wafer shaped device from said extended posts;
   said posts being movable to lower a wafer shaped device placed thereon to a position to be held by said platform and to raise such wafer shaped device to permit its removal by said arm.

2. The invention according to claim 1 wherein said platform further includes a plurality of vacuum members for holding said wafer shaped device when said posts are at said home position.

3. The invention according to claim 1 wherein said posts are positioned around the center of said platform.

4. The invention according to claim 1 wherein said posts are triangularly positioned around the center of said platform.

5. The invention according to claim 1 wherein said posts are movable by a piston device.

6. The invention according to claim 5 wherein said piston device is a pneumaticly actuated device.

7. The invention according to claim 6 wherein said piston device includes a bellows which is inflated to move said posts to said extended position and deflated to move said posts to said home position.

8. The invention according to claim 1 wherein each of said posts includes vacuum means for holding said wafer shaped device when in said extended position.

9. The invention according to claim 8 wherein said posts are movable by a piston device.

10. The invention according to claim 9 wherein said piston device is a pneumaticly actuated device.

11. The invention according to claim 10 wherein said pistion device includes a bellows which is inflated to move said posts to said extended position and deflated to move said posts to said home position.

12. The invention according to claim 8 wherein said platform further includes a plurality of vacuum members for holding said wafer shaped device when said posts are at said home position.

13. The invention according to claim 8 wherein said posts are triangularly positioned around the center of said platform.

14. The invention according to claim 8 wherein said posts are positioned around the center of said platform.

15. The invention according to claim 14 wherein said platform further includes a plurality of vacuum members for holding said wafer shaped device when said posts are at said home position.

* * * * *